United States Patent
Kunimoto et al.

(10) Patent No.: US 9,332,658 B2
(45) Date of Patent: May 3, 2016

(54) WIRING BOARD, SEMICONDUCTOR DEVICE, AND METHOD FOR MANUFACTURING WIRING BOARD

(71) Applicant: SHINKO ELECTRIC INDUSTRIES CO., LTD., Nagano-shi, Nagano (JP)

(72) Inventors: Yuji Kunimoto, Nagano (JP); Noriyoshi Shimizu, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days.

(21) Appl. No.: 14/459,706

(22) Filed: Aug. 14, 2014

(65) Prior Publication Data
US 2015/0053460 A1    Feb. 26, 2015

(30) Foreign Application Priority Data
Aug. 20, 2013    (JP) .................. 2013-170366

(51) Int. Cl.
*H05K 1/09* (2006.01)
*H05K 3/46* (2006.01)

(52) U.S. Cl.
CPC .... *H05K 3/4602* (2013.01); *H05K 2201/09518* (2013.01); *H05K 2201/09609* (2013.01)

(58) Field of Classification Search
CPC .............. H05K 1/0298; H05K 1/115; H05K 2201/09009; H05K 2201/09518; H05K 2201/09718; H05K 2201/09609; H05K 1/0236; H05K 2201/0929; H05K 2201/093; H05K 1/0253
See application file for complete search history.

(56) References Cited

U.S. PATENT DOCUMENTS

| | | | |
|---|---|---|---|
| 5,488,542 A * | 1/1996 | Ito ...................... | H01L 23/5385 174/259 |
| 6,184,477 B1 * | 2/2001 | Tanahashi .................... | 174/261 |
| 6,621,384 B1 * | 9/2003 | Handforth et al. ............ | 333/238 |
| 2002/0139566 A1 * | 10/2002 | Strandberg ........... | H05K 3/4602 174/250 |
| 2006/0237229 A1 * | 10/2006 | Sugahara ...................... | 174/266 |
| 2009/0139760 A1 * | 6/2009 | Tanaka .......................... | 174/264 |

FOREIGN PATENT DOCUMENTS

| | | |
|---|---|---|
| JP | 2000-101237 | 4/2000 |
| JP | 2012-099536 | 5/2012 |

* cited by examiner

*Primary Examiner* — Steven T Sawyer
(74) *Attorney, Agent, or Firm* — Rankin, Hill & Clark LLP

(57) ABSTRACT

A wiring board includes first and second insulating layers, first and second through holes, a via, a plane layer, and signal wirings. The first insulating layer covers a first wiring layer. The first through hole opens on a surface of the first insulating layer and exposes a surface of the first wiring layer. The via fills the first through hole. The plane layer is connected to the via and is stacked on the first insulating layer. The second through hole opens on a surface of the plane layer and exposes the surface of the first insulating layer. The second insulating layer at least partially fills the second through hole and covers the plane layer. The signal wirings are stacked on the second insulating layer. The first through hole overlaps the signal wirings in a plan view. The second through hole does not overlap the signal wirings in a plan view.

5 Claims, 13 Drawing Sheets

WIRING BOARD, SEMICONDUCTOR DEVICE, AND METHOD FOR MANUFACTURING WIRING BOARD

CROSS-REFERENCE TO RELATED APPLICATION(S)

This application claims priority from Japanese Patent Application No. 2013-170366, filed on Aug. 20, 2013, the entire contents of which are herein incorporated by reference.

BACKGROUND

1. Technical Field

Exemplary embodiments of the invention relates to a wiring board, a semiconductor device, and a method for manufacturing a wiring board.

2. Related Art

There have been wiring boards on which electronic components such as semiconductor elements are to be mounted. In order to form wiring patterns in a high density, such a wiring board has been provided in which plural wiring layers and plural insulating layers are stacked on both of upper and lower surfaces of a core substrate by the build-up technique.

For the purposes of ensuring flatness for formation of wirings, matching characteristic impedances, and the like, plane layers (for example, a power supply plane and/or a ground plane) are planarly formed just below wiring layers in this wiring board. Also, in this wiring board, a large number of through holes are formed in the plane layers in order to enhance the adhesiveness between each plane layer and a corresponding insulating layer just below each plane layer (for example, see JP 2000-101237 A and JP 2012-099536 A).

SUMMARY

However, where through holes are formed just below a wiring layer, the flatness provided by a plane layer would be deteriorated, which leads to that it is difficult to accurately form fine wirings just above the plane layer. On the other hand, if it is omitted to form the through holes, the adhesiveness between the plane layer and an insulating layer just below the plane layer would be lowered, which results in that the plane layer easily peels off.

According to one aspect of the invention, a wiring board includes a first insulating layer, a first through hole, a via, a plane layer, a second through hole, a second insulating layer, and signal wirings. The first insulating layer covers a first wiring layer. The first through hole opens on a surface of the first insulating layer and exposes a surface of the first wiring layer. The via fills the first through hole. The plane layer is connected to the via and is stacked on the first insulating layer. The second through hole opens on a surface of the plane layer and exposes the surface of the first insulating layer. The second insulating layer at least partially fills the second through hole and covers the plane layer. The signal wirings are stacked on the second insulating layer. The first through hole overlaps the signal wirings in a plan view. The second through hole does not overlap the signal wirings in a plan view.

The above configuration offers such an advantage that while the plane layer is prevented from peeling off, fine wirings can be formed accurately.

DETAILED DESCRIPTION

Hereinafter, exemplary embodiments will be described with reference to the accompanying drawings.

It is noted that in order to facilitate understanding of features, the accompanying drawings may show feature portions in an enlarged fashion for the sake of convenience and that the dimension ratios between components and the like are not always identical with the actual ones. It is also noted that in order to facilitate understanding of the sectional structures of respective members, some of the members may be given dotted patterns in sectional views in place of hatching, and hatching for other some members may be omitted in sectional views.

Figure 1:
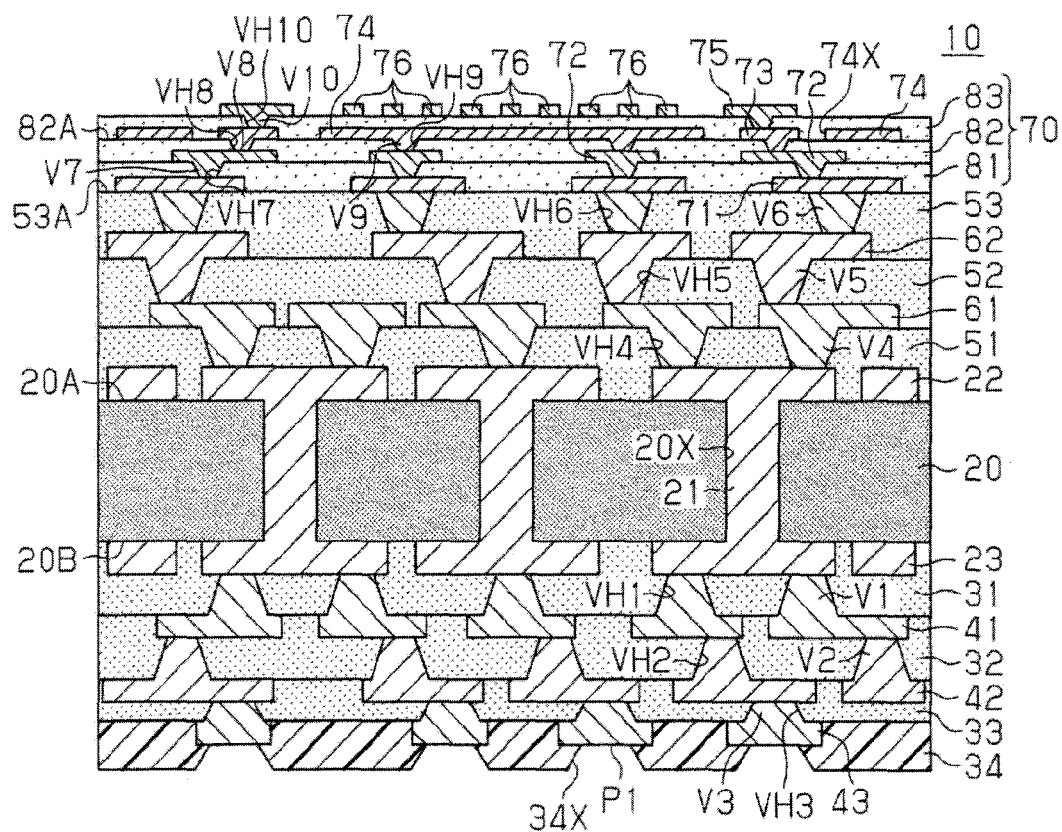
FIG. 1 is a schematic sectional view showing a wiring board according to one exemplary embodiment.

As shown in FIG. 1, a wiring board 10 has a core substrate 20 in an intermediate part of the wiring board 10 in a thickness direction. The core substrate 20 may be, for example, a so-called glass-epoxy substrate which is obtained by (i) impregnating glass cloth (glass woven fabric) serving as a reinforcing material with a thermosetting insulating resin containing an epoxy resin as a main component and (ii) curing the thermosetting insulating resin. The reinforcing material is not limited to glass cloth. Examples of the reinforcing material include glass non-woven fabric, aramid woven fabric, aramid non-woven fabric, LCP (Liquid Crystal Polymer) woven fabric, and LCP non-woven fabric. The thermosetting insulating resin is not limited to an epoxy resin. Examples of the thermosetting insulating resin include a polyimide resin and a cyanate resin. The core substrate 20 may be, for example, in a range of about 80 to 800 μm in thickness.

The core substrate 20 is formed with through holes 20X at required positions (in FIG. 1, three through holes 20X are provided). The through holes 20X are formed so as to pass through from an upper surface 20A of the core substrate 20 to a lower surface 20B of the core substrate 20. A through electrode 21 which passes through the core substrate 20 in the thickness direction is formed in each through hole 20X. The through electrode 21 fills in each through hole 20X. Although not illustrated, each through electrode 21 is formed into, for example, an approximately circular shape in a plan view. The diameter of the through electrode 21 may be, for example, in a range of about 50 to 100 μm. Examples of materials of the through electrodes 21 include copper (Cu) and a copper alloy.

A wiring layer 22 is formed on the upper surface 20A of the core substrate 20. A wiring layer 23 is formed on the lower surface 20B of the core substrate 20. The wiring layers 22, 23 are electrically connected to each other through the through electrodes 21. Examples of materials of the wiring layers 22, 23 include copper and a copper alloy. The wiring layers 22, 23 may be, for example, in a range of about 15 to 35 μm in thickness.

An insulating layer 31, a wiring layer 41, an insulating layer 32, and a wiring layer 42 are stacked on the lower surface 20B of the core substrate 20 in order. The insulating layer 31 covers the wiring layer 23. The wiring layer 41 is stacked on a lower surface of the insulating layer 31. The insulating layer 32 covers the wiring layer 41. The wiring layer 42 is stacked on a lower surface of the insulating layer 32 are sequentially stacked. Also, an insulating layer 33, a wiring layer 43, and a solder resist layer 34 are stacked on the lower surface of the insulating layer 32 in order. The insulating layer 33 covers the wiring layer 42. The wiring layer 43 is stacked on a lower surface of the insulating layer 33. The solder resist layer 34 is stacked on a lower surface of the insulating layer 33 so as to cover a part of the wiring layer 43.

Through holes VH1 are formed in the insulating layer 31 at required positions. The through holes VH1 pass through the insulating layer 31 in the thickness direction. A via V1 is formed in each through hole VH1 and electrically connects the wiring layers 23, 41 to each other. The vias V1 are formed so as to fill the through holes VH1. Also, through holes VH2 are formed in the insulating layer 32 at required positions. The through holes VH2 pass through the insulating layer 32 in the thickness direction. A via V2 is formed in each through hole VH2 and electrically connects the wiring layers 41, 42 to each other. The vias V2 are formed so as to fill the through holes VH2. Through holes VH3 are formed in the insulating layer 33 at required positions. The through holes VH3 pass through the insulating layer 33 in the thickness direction. A via V3 is formed in each through hole VH3 and electrically connects the wiring layers 42, 43 to each other. The vias V3 are formed so as to fill the through holes VH3. The through holes VH1, VH2, VH3 and the vias V1, V2, V3 are formed into tapered shapes. The diameter of each of the through holes VH1, VH2, VH3 and the vias V1, V2, V3 increases from the upper side (the core substrate 20 side) in FIG. 1 towards the lower side (the wiring layer 43 side) in FIG. 1. For example, the through holes VH1 to VH3 are formed into truncated conical shapes. The opening diameter of an upper open end of each of the through holes VH1 to VH3 is smaller than that of a lower open end of each of the through holes VH1 to VH3. The vias V1 to V3 are formed into truncated conical shapes. An upper surface of each of the vias V1 to V3 is smaller in diameter than a lower surface of each of the vias V1 to V3.

The wiring layers 41, 42, 43 may be, for example, in a range of about 15 to 20 μm in thickness. The thickness extending from the lower surface of the wiring layer 23 to the lower surface of the insulating layer 31, the thickness extending from the lower surface of the wiring layer 41 to the lower surface of the insulating layer 32, and the thickness extending from the lower surface of the wiring layer 42 to the lower surface of the insulating layer 33 may be, for example, in a range of about 15 to 35 μm. Examples of materials of the wiring layers 41, 42, 43 and the vias V1, V2, V3 include copper and a copper alloy. Examples of materials of the insulating layers 31, 32, 33 include (i) an insulating resin such as an epoxy resin and a polyimide resin, (ii) a resin material in which a filler such as silica or alumina is mixed with the insulating resin, and (iii) a thermosetting insulating resin.

Opening portions 34X are formed in the solder resist layer 34. A part of the lowermost wiring layer 43 is exposed through the opening portions 34X to serve as external connection pads P1. The external connection pads P1 are configured to be connected to external connection terminals such as solder balls and lead pins. The external connection terminals are used in mounting the wiring board 10 on a mount board such as a motherboard. As required, the OSP (Organic Solderability Preservative) process may be applied to the wiring layer 43, which is exposed from the opening portions 34X, to form OSP films. Then, the external connection terminals may be connected to the OSP films. Alternatively, metal layers may be formed on the wiring layer 43, which is exposed from the opening portions 34X. Then, the external connection terminals may be connected to the metal layers. Examples of the metal layers are a gold (Au) layer, a nickel (Ni)/Au layer (a metal layer in which an Ni layer and an Au layer are stacked in this order), and an Ni/palladium (Pd)/Au layer (a metal layer in which an Ni layer, a Pd layer, and an Au layer are stacked in this order). The Ni layer, the Au layer, and the Pd layer may be metal layers (electroless plated metal layers) which are formed by, for example, an electroless plating method. Also, the Ni layer may be a metal layer consisting of Ni or an Ni alloy. The Au layer may be a metal layer consisting of Au or an Au alloy. The Pd layer may be a metal layer consisting of Pd or a Pd alloy. Alternatively, the wiring layer 43, which is exposed from the opening portions 34X, may be used as the external connection terminals. Further alternatively, where OSP films or metal layers are formed on the wiring layer 43, the OSP films or the metal layers may be used as the external connection terminals.

The opening portions 34X and the external connection pads P1 have, for example, circular shapes in a plan view. The diameters of the opening portions 34X and the external connection pads P1 may be, for example, in a range of about 200 to 300 μm. The thickness extending from the lower surface of the wiring layer 43 to the lower surface of the solder resist layer 34 may be, for example, in a range of about 20 to 40 μm. Examples of a material of the solder resist layer 34 include an insulating resin such as an epoxy resin and an acrylic resin.

On the other hand, an insulating layer 51, a wiring layer 61, an insulating layer 52, a wiring layer 62 and an insulating layer 53 are stacked on the upper surface 20A of the core substrate 20 sequentially. The insulating layer 51 covers the wiring layer 22. The wiring layer 61 is stacked on an upper surface of the insulating layer 51. The insulating layer 52 covers the wiring layer 61. The wiring layer 62 is stacked on an upper surface of the insulating layer 52. The insulating layer 53 covers the wiring layer 62.

Through holes VH4 are formed in the insulating layer 51 at required positions. The through holes VH4 pass through the insulating layer 51 in the thickness direction. A via VH4 is formed in each through hole VH4 and electrically connects the wiring layers 22, 61 to each other. The vias V4 are formed so as to fill the through holes VH4. Through holes VH5 are formed in the insulating layer 52 at required positions. The through holes VH5 pass through the insulating layer 52 in the thickness direction. A via VH5 is formed in each through hole VH5 and electrically connects the wiring layers 61, 62 to each other. The vias V5 are formed so as to fill the through holes VH5. Through holes VH6 are formed in the insulating layer 53, through holes VH6 at required positions. The through holes VH6 pass through the insulating layer 53 in the thickness direction. A via V6 is formed in each through hole VH6 and electrically connects the wiring layer 62 to a wiring layer 71 to each other. The wiring layer 71 is formed on an upper surface 53A of the insulating layer 53. The vias V6 are formed so as to fill the through holes VH6. The through holes VH4, VH5, VH6 and the vias V4, V5, V6 are formed into tapered shapes. The diameter of each of the through holes VH4, VH5, VH6 and the vias V4, V5, V6 increases from the lower side (the core substrate 20 side) in FIG. 1 toward the upper side in FIG. 1. For example, the through holes VH4 to VH6 are formed into inverted truncated conical shapes. The opening diameter of an upper open end of each of the through holes VH4 to VH6 is larger than that of a lower open end of each of the through holes VH4 to VH6. The vias V4 to V6 are formed into inverted truncated conical shapes. An upper surface of each of the vias V4 to V6 is larger in diameter than a lower surface of each of the vias V4 to V6.

The wiring layers 61, 62 may be, for example, in a range of about 15 to 20 µm in thickness. The thickness extending from the upper surface of the wiring layer 22 to the upper surface of the insulating layer 51, the thickness extending from the upper surface of the wiring layer 61 to the upper surface of the insulating layer 52, and the thickness extending from the upper surface of the wiring layer 62 to the upper surface of the insulating layer 53 may be, for example, in a range of about 15 to 35 µm. Examples of materials of the wiring layers 61, 62 and the vias V4 to V6 include copper and a copper alloy. Examples of materials of the insulating layers 51 to 53 include (i) an insulating resin such as an epoxy resin and a polyimide resin, (ii) a resin material in which a filler such as silica or alumina is mixed with the insulating resin, and (iii) a thermosetting insulating resin.

The upper surface 53A of the insulating layer 53 is a smooth surface (low-roughness surface) having small asperities. For example, the surface roughness of the upper surface 53A of the insulating layer 53 is lower than that of inner surfaces of the through holes VH6. The surface roughness Ra of the upper surface 53A of the insulating layer 53 may be, for example, in a range of about 10 to 200 nm. The surface roughness Ra is one of numerical values indicating a surface roughness. The surface roughness Ra is called the arithmetic mean roughness. Specifically, the surface roughness Ra is obtained by measuring absolute values of heights, which vary within a measurement region, from a surface functioning as an average line and by arithmetically averaging the measured values.

A fine wiring structure 70 is stacked on the upper surface 53A of the insulating layer 53. In the fine wiring structure 70, wiring layers that are finer than the wiring layers 61, 62 are stacked. Specifically, in the fine wiring structure 70, a wiring layer 71, an insulating layer 81, a wiring layer 72, and an insulating layer 82 are stacked in order. The wiring layer 71 is stacked on the upper surface 53A of the insulating layer 53. The insulating layer 81 covers the wiring layer 71. The wiring layer 72 is stacked on an upper surface of the insulating layer 81. The insulating layer 82 covers the wiring layer 72. Also, in the fine wiring structure 70, a wiring layer 73, a plane layer 74, an insulating layer 83, a wiring layer 75, and signal wirings 76 are stacked in order. The wiring layer 73 and the plane layer 74 are stacked on an upper surface 82A of the insulating layer 82. The insulating layer 83 covers the wiring layer 73 and the plane layer 74. The wiring layer 75 and the signal wirings 76 are stacked on an upper surface of the insulating layer 83.

The wiring layers 71, 72, 73 and the signal wirings 76 are formed to be finer than the wiring layers 61, 62 and the like which are formed below the fine wiring structure 70. For example, the wiring layers 61, 62 include wirings whose line/space (L/S) is about 20 µm/20 µm. That is, the wirings in the wiring layers 61, 62 are arranged, for example, in about 40 µm pitch. By contrast, the wiring layers 71, 72, 73 and the signal wirings 76 include fine wirings L/S of which are, for example, less than 10 µm/10 µm. That is, the fine wirings in the wiring layers 71, 72, 73 and the signal wirings 76 are arranged, for example, in about 20 µm pitch or less. For example, the wiring layer 71 includes fine wirings L/S of which is about 5 µm/5 µm. That is, the fine wirings in the wiring layer 71 are arranged in about 10 µm pitch. The wiring layers 72, 73 include fine wirings L/S of which is about 3 to 4 µm/3 to 4 µm. That is, the fine wirings in the wiring layers 72, 73 are arranged in about 6 to 8 µm pitch. Also, the signal wirings 76 include fine wirings L/S of which is about 1 to 2 µm/1 to 2 µm. That is, the fine wirings in the signal wirings 76 are arranged in about 2 to 4 µm pitch. The wiring layers 71, 72, 73, 75, the plane layer 74, and the signal wirings 76 are thinner than the wiring layers 61, 62 and the like, which are formed below the fine wiring structure 70. For example, the wiring layers 71, 72, 73, 75, the plane layer 74, and the signal wirings 76 may be in a range of about 1 to 5 µm (preferably, 2.5 to 3.0 µm) in thickness.

The wiring layer 71 is stacked on upper end surfaces of the vias V6 and the upper surface 53A of the insulating layer 53. The wiring layer 71 is connected to the upper end surfaces of the vias V6. The wiring layer 71 is formed so as to cover parts, around the vias V6, of the upper surface 53A of the insulating layer 53.

Through holes VH7 are formed in the insulating layer 81. The through holes VH7 are opened at required positions of the upper surface of the insulating layer 81. The through holes VH7 pass through the insulating layer 81 in the thickness direction. Parts of the upper surface of the wiring layer 71 are exposed through the through holes VH7. The through holes VH7 are formed into tapered shapes. The diameter of each of the through holes VH7 increases from the lower side (the wiring layer 71 side) in FIG. 1 towards the upper side (the wiring layer 72 side) in FIG. 1. For example, the through holes VH7 are formed into approximately inverted trapezoidal shapes in a sectional view and approximately circular shapes in a plan view. It is preferable that a material of the insulating layer 81 be an insulating resin which is different from the materials of the insulating layers 51 to 53 and the like, which are formed below the fine wiring structure 70. It is more preferable that the material of the insulating layer 81 be a photosensitive insulating resin. Examples of the material of the insulating layer 81 include an insulating resin such as a phenol resin and a polyimide resin.

A via V7 is formed in each through hole VH7 and electrically connects the wiring layers 71, 72 to each other. The vias V7 are formed so as to pass through the insulating layer 81 in the thickness direction. Furthermore, the vias V7 are formed so as to fill the through holes VH7. Similarly to the through holes VH7, the vias V7 are formed into tapered shapes so that the diameter of each of the vias VH7 increases from the lower side (the wiring layer 71 side) in FIG. 1 towards the upper side (the wiring layer 72 side) in FIG. 1. For example, the vias V7 are formed into inverted truncated conical shapes. The upper surfaces of the vias V7 are larger in diameter than the lower surfaces of the vias V7. The diameter of the upper surfaces of the vias V7 may be, for example, in a range of about 10 to 20 μm. The diameter of the lower surfaces of the vias V7 may be, for example, in a range of about 5 to 15 μm.

The wiring layer 72 is stacked on the insulating layer 81. The wiring layer 72 is connected to the upper surfaces of the vias V7. The wiring layer 72 is formed integrally with the vias V7. Examples of materials of the wiring layers 71, 72 and the vias V7 include copper and a copper alloy.

Through holes VH8, VH9 are formed in the insulating layer 82. The through holes VH8, VH9 are opened at required positions of the upper surface 82A of the insulating layer 82. The through holes VH8, VH9 pass through the insulating layer 82 in the thickness direction. A via V8 is formed in each through hole VH8 and electrically connects the wiring layers 72, 73 to each other. The vias V8 fill the through holes VH8. A via V9 is formed in each through hole VH9 and electrically connects the wiring layer 72 to the plane layer 74. The vias V9 fill the through holes VH9. The through holes VH8, VH9 and the vias V8, V9 are formed into tapered shapes. The diameter of each of the through holes VH8, VH9 and the vias V8, V9 increases from the lower side (the wiring layer 72 side) in FIG. 1 towards the upper side (the wiring layer 73 side) in FIG. 1. For example, the through holes VH8, VH9 are formed into inverted truncated conical shapes. An opening diameter of the upper open end of each of the through holes VH8, VH9 is larger than that of the lower open end of each of the through holes VH8, VH9. The vias V8, V9 are formed into inverted truncated conical shapes. An upper surface of each of the vias V8, V9 is larger in diameter than a lower surface of each of the vias V8, V9.

The wiring layer 73 is stacked on the upper surface 82A of the insulating layer 82. The wiring layer 73 is connected to the upper surfaces of the vias V8. The wiring layer 73 is formed integrally with the vias V8. The plane layer 74 is stacked on the upper surface 82A of the insulating layer 82. The plane layer 74 is connected to the upper surfaces of the vias V9. The plane layer 74 is formed integrally with the vias V9. A part of the plane layer 74 is formed just below (beneath) the signal wirings 76. The plane layer 74 is a conductive layer which is patterned in a solid shape. Through holes 74X are formed in the plane layer 74. The through holes 74X are opened at required positions of an upper surface of the plane layer 74. The through holes 74X pass through the plane layer 74 in the thickness direction. For example, the plane layer 74 is insulated from the wiring layer 73. Specifically, the plane layer 74 may be spaced from the wiring layer 73 with a predetermined gap therebetween. The plane 74 is patterned on the upper surface 82A in a solid shape so as to surround the wiring layer 73. In other words, the through holes 74X which pass through the plane layer 74 in the thickness direction are formed at the required positions of the plane layer 74, and the wiring layer 73 is located in the through holes 74X.

The insulating layer 83 is stacked on the upper surface 82A of the insulating layer 82. The insulating layer 83 covers the wiring layer 73 and the plane layer 74. The insulating layer 83 at least partially fills the through holes 74X. Through holes VH10 are formed in the insulating layer 83. The through holes VH10 are opened at required positions of the upper surface of the insulating layer 83. The through holes VH10 pass through the insulating layer 83 in the thickness direction. A via V10 is formed in each through hole VH10. The vias 10 electrically connect the wiring layer 73 to the wiring layer 75 or the signal wirings 76. The vias V10 fill the through holes VH10. The through holes VH10 and the vias V10 are formed into tapered shapes. The diameter of each of the through holes VH10 and the vias V10 increases from the lower side (the wiring layer 73 side) in FIG. 1 towards the upper side (the wiring layer 75 side) in FIG. 1. For example, the through holes VH10 are formed into inverted truncated conical shapes. An opening diameter of an upper open end of each through hole VH10 is larger than that of a lower open end of each through hole VH10. The vias V10 are formed into inverted truncated conical shapes. An upper surface of each via V10 is larger in diameter than a lower surface of each via V10.

The wiring layer 75 and the signal wirings 76 are stacked on the insulating layer 83. The wiring layer 75 is stacked on the insulating layer 83 so as to be connected to the upper surfaces of the vias V10. The wiring layer 75 is formed integrally with the vias V10. The wiring layer 75 is a plane layer (for example, a power supply plane or a GND plane) which is patterned on, for example, the insulating layer 83 in a solid shape. As described above, for example, the signal wirings 76 have fine wirings L/S of which is equal to 10 μm/10 μm or less. That is, the fine wirings of the signal wirings 76 are arranged in 20 μm pitch. It is preferable that L/S of the fine wirings of the signal wirings 76 be 1 to 2 μm/1 to 2 μm. That is, it is preferable that the fine wirings of the signal wirings 76 are arranged in 2 μm pitch to 4 μm pitch.

Figure 2A:
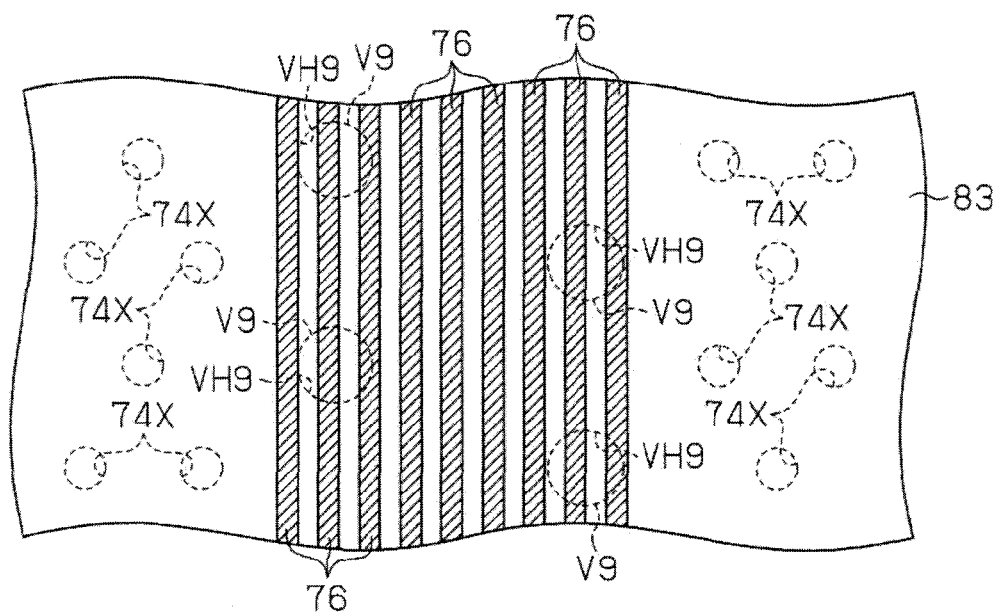
FIG. 2A is a schematic plan view showing planar arrangement of signal wirings and through holes.
Figure 2B:
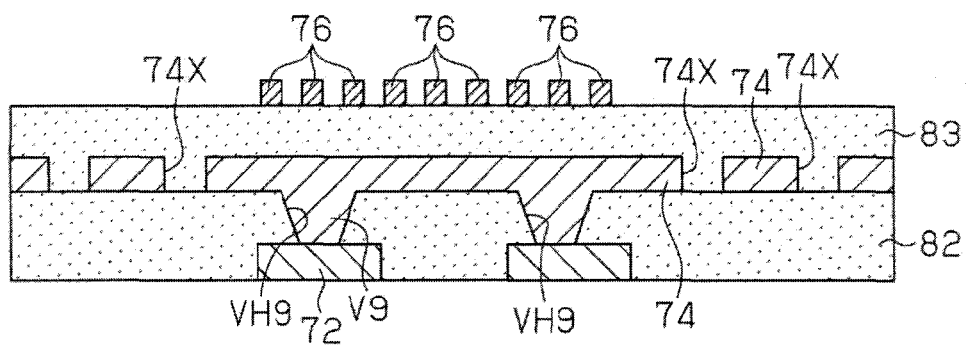
FIG. 2B is an enlarged sectional view showing arrangement of the signal wirings and the through holes.

As shown in FIG. 2A, for example, the planar shape of each of the large number of signal wirings 76 is formed into a substantially rectangular shape (strip-like shape). As shown in FIGS. 2A and 2B, the large number of signal wirings 76 are disposed so as to be separated from one another, be in parallel to each other, and be adjacent to each other. Some of the signal wirings 76 overlap the through holes VH9 and the vias V9 in a plan view. The signal wirings 76 do not overlap the through holes 74X in a plan view. In other words, the through holes VH9 (the vias V9 which are formed integrally with the plane layer 74) overlap a part of the signal wirings 76 in a plan view. Namely, the through holes VH9 (vias V9) overlap, in a plan view, a region where the fine wirings are densely provided. Furthermore, the through holes 74X which are formed in the plane layer 74 do not overlap the signal wirings 76 in a plan view. Namely, the through holes 74X can be formed in the following positions and/or regions. For example, the through holes 74X may be formed at positions where the through holes 74X do not overlap, in a plan view, a region in which the fine wirings are densely provided. Also, the through holes 74X may be formed in a region where it is not necessary to consider the flatness for formation of the signal wirings 76 or electric characteristics of the signal wirings 76. Furthermore, the through hole 74X may be formed in a region where the through holes 74X do not seriously affect the flatness for the formation of the signal wirings 76 or the electrical characteristics of the signal wirings 76.

For example, bumps (not shown) of semiconductor chips which are mounted on the wiring board 10 are connected to the signal wirings 76. The signal wirings 76 are used, for example, as wirings which electrically connect a plurality of semiconductor chips, mounted on the wiring board 10, to one another. In this case, for example, bumps of one of the semiconductor chips are connected to one end side of the signal wirings 76. The signal wirings 76 are routed in a planar direction. Bumps of another one of the semiconductor chips are connected to the other end side of the signal wirings 76 (a routing destination side of the signal wirings 76). Moreover, the signal wirings 76 are used, for example, as wirings which electrically connect the semiconductor chips mounted on the wiring board 10 to the wiring layer 75 (the power supply plane or the GND plane). Furthermore, for example, some of the signal wirings 76 are connected to the lower wiring layer 73 and the like through the vias V10.

The insulating layers 81 to 83 shown in FIG. 1 are thinner than the insulating layers 51 to 53 and the like which are formed below the fine wiring structure 70. For example, the thickness extending from the upper surface of the wiring layer 71 to the upper surface of the insulating layer 81, the thickness extending from the upper surface of the wiring layer 72 to the upper surface 82A of the insulating layer 82, and the thickness extending from the upper surface of the wiring layer 73 to the upper surface of the insulating layer 83 may be, for example, in a range of about 1 to 20 μm (preferably, in a range of about 3 to 5 μm). Examples of the materials of the wiring layers 73, 75, the plane layer 74, the signal wirings 76, and the vias V8 to V10 include copper and a copper alloy. Similarly to the insulating layer 81, it is preferable that the materials of the insulating layers 82, 83 be an insulating resin which is different from the materials of the insulating layers 51 to 53 and the like which are formed below the fine wiring structure 70. It is more preferable that the materials of the insulating layers 82, 83 be a photosensitive insulating resin. Examples of the materials of the insulating layers 82, 83 include an insulating resin such as a phenol resin and a polyimide resin.

Next, the function of the wiring board 10 will be described.

In the region which is just below (beneath) the signal wirings 76 (the fine wirings L/S of which is 10 μm/10 μm or less), the through holes 74X are not formed in the plane layer 74 but the vias V9 through which the plane layer 74 is connected to the lower wiring layer 72 are formed. As compared with the case where the vias V9 are not formed, the vias V9 increases a contact area between (i) the vias V9 and the plane layer 74 and (ii) the insulating layer 82. Therefore, the adhesiveness between the plane layer 74 and the insulating layer 82 can be improved. In the beneath region described above, the through holes 74X are not formed. Therefore, high flatness can be ensured. With this configuration, the signal wirings 76 (fine wirings) can be formed accurately, and the quality of the signal wirings 76 can be improved.

Next, a method for manufacturing the wiring board 10 will be described.

Figure 3A:
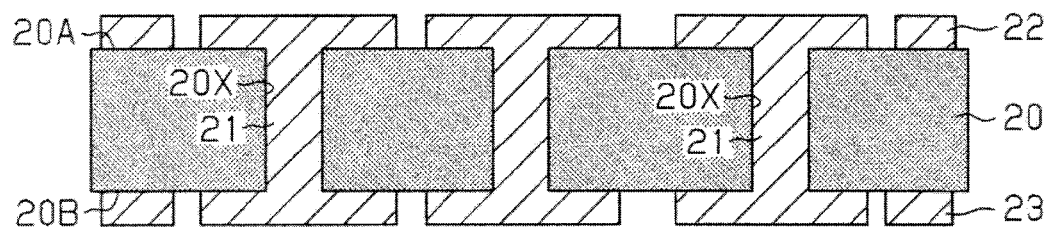
FIGS. 3A to 3C are schematic sectional views showing a method for manufacturing the wiring board according to the one exemplary embodiment.

In a step shown in FIG. 3A, first, the through holes 20X are formed in, for example, a copper clad laminate (CCL) which will serve as the core substrate 20. The through electrodes 21 are formed in the through holes 20X by electrolytic plating or paste filling. Then, the wiring layer 22 is formed on the upper surface 20A of the core substrate 20 by the subtractive method. Also, the wiring layer 23 is formed on the lower surface 20B of the core substrate 20 by the subtractive method.

Figure 3B:
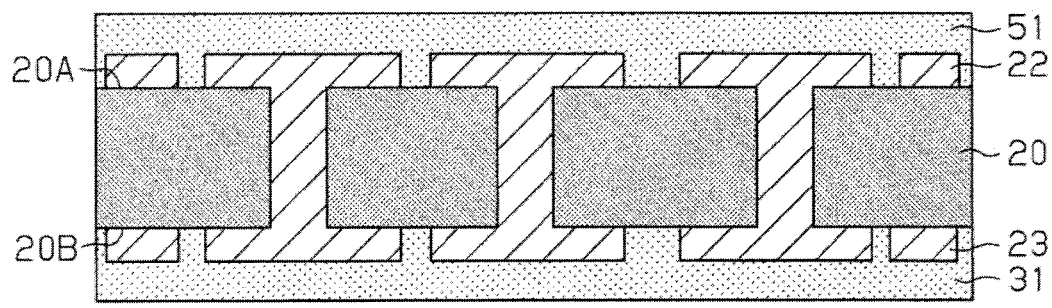

Next, in a step shown in FIG. 3B, the insulating layer 31 is formed so as to cover the lower surface 20B of the core substrate 20 and the wiring layer 23. The insulating layer 51 is formed so as to cover the upper surface 20A of the core substrate 20 and the wiring layer 22. The insulating layers 31, 51 can be formed by, for example, laminating resin films to the core substrate 20 and then performing a thermal process at a temperature of about 130 to 200° C. while pressing the resin films to cure the films. Examples of the resin film include a film of a thermosetting insulating resin such as an epoxy resin.

Figure 3C:
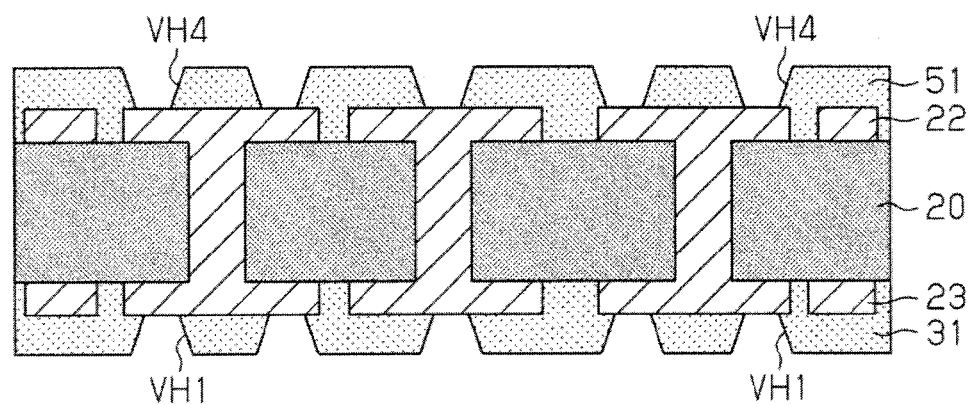

Then, in a step shown in FIG. 3C, the through holes VH1 are formed at the predetermined positions in the insulating layer 31 so that a part of the lower surface of the wiring layer 23 is exposed through the through holes VH1. Also, the through holes VH4 are formed at the predetermined positions in the insulating layer 51 so that a part of the upper surface of the wiring layer 22 is exposed through the through holes VH4. The through holes VH1, VH4 may be formed by, for example, a laser processing method using a CO2 laser, a UV-YAG laser, or the like. In the case where the insulating layers 31, 51 are formed of a photosensitive resin, the through holes VH1, VH4 may be formed by, for example, the photolithography method.

In the case where the through holes VH1, VH4 are formed by the laser processing method, then, desmearing is performed to remove resin smears adheres to the exposed surfaces of the wiring layers 22, 23 which are exposed to the through holes VH1, VH4.

Figure 4A:
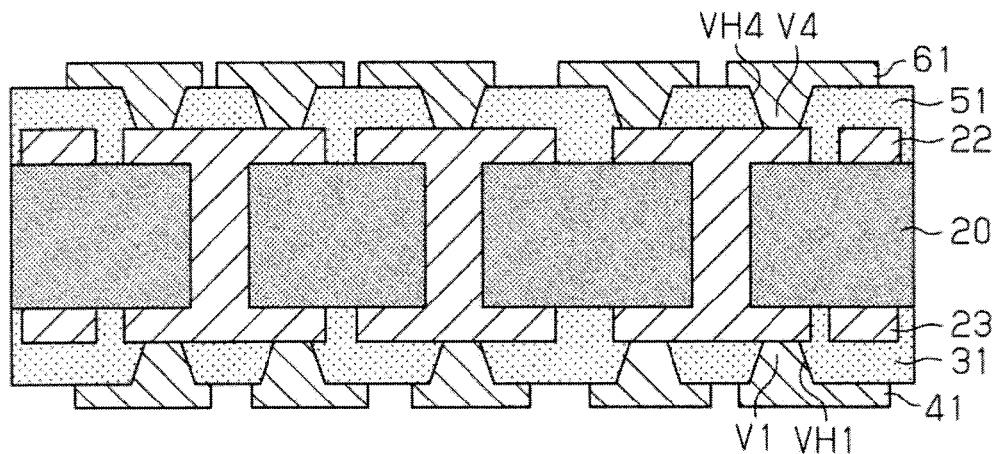
FIGS. 4A and 4B are schematic sectional views showing the method for manufacturing the wiring board according to the one exemplary embodiment.
Figure 4B:
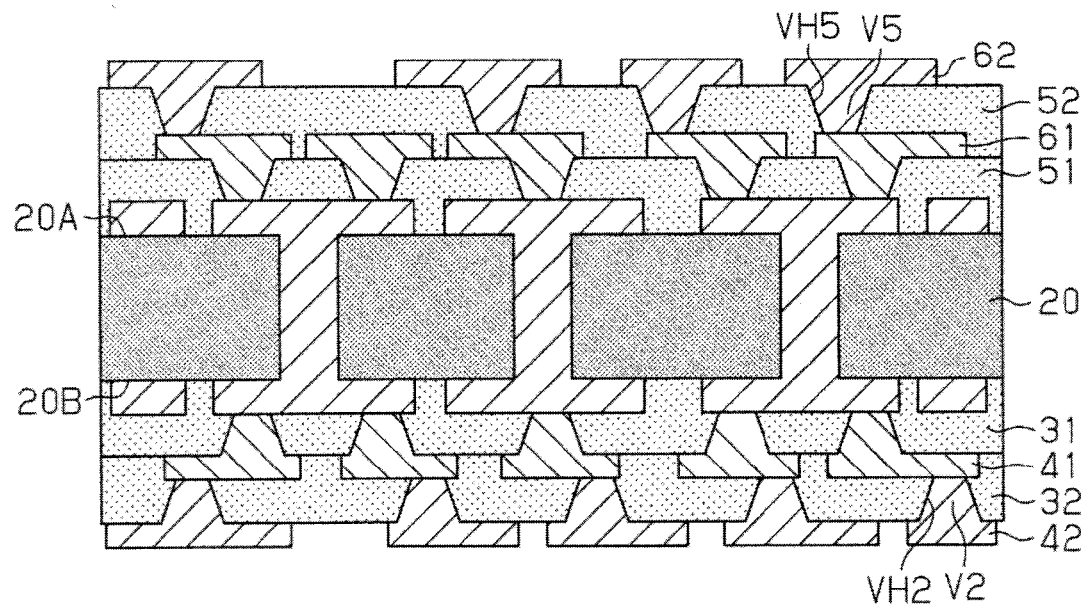

Subsequently, in a step shown in FIG. 4A, the vias V1 are formed in the through holes VH1 of the insulating layer 31. The wiring layer 41 is stacked on the lower surface of the insulating layer 31 so that the wiring layer 41 is electrically connected to the wiring layer 23 through the vias V1. Also, the vias V4 are formed in the through holes VH4 of the insulating layer 51. The wiring layer 61 is stacked on the upper surface of the insulating layer 51 so that the wiring layer 61 is electrically connected to the wiring layer 22 through the vias V4. The vias V1, V4 and the wiring layers 41, 61 may be formed by using any one of various wiring forming methods such as the semi-additive method and the subtractive method. With such a wiring forming method, the vias V1, V4 and the wiring layers 41, 61 are formed of a plating metal such as copper or a copper alloy.

Next, steps which are similar to those shown in FIGS. 3B to 4A are performed again. Thereby, as shown in FIG. 4B, the insulating layer 32 and the wiring layer 42 are stacked on the lower surface 20B side of the core substrate 20. Also, the insulating layer 52 and the wiring layer 62 are stacked on the upper surface 20A side of the core substrate 20.

Figure 5A:
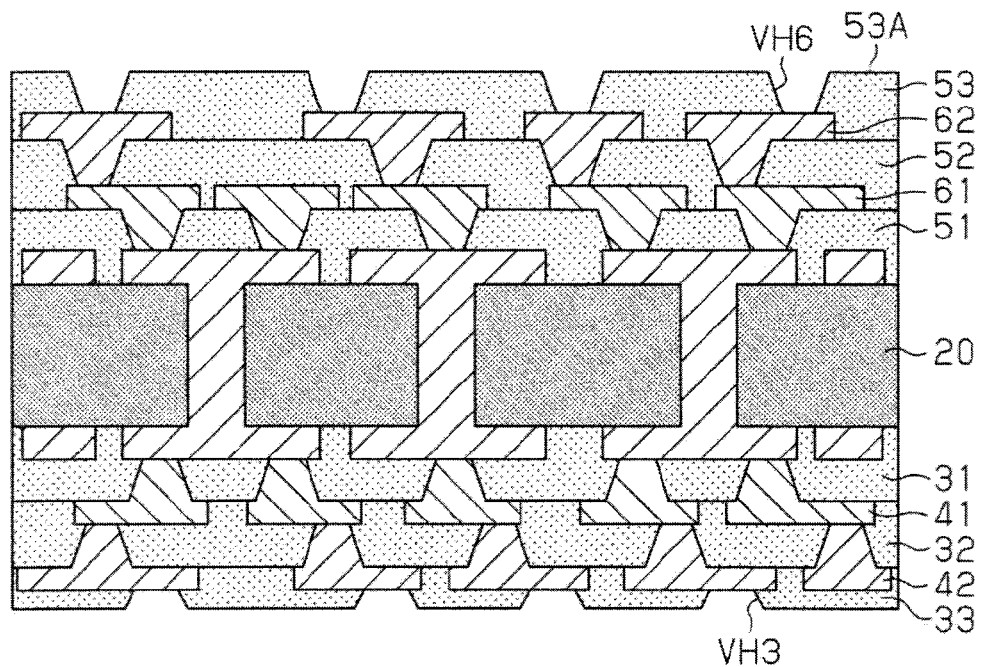
FIGS. 5A and 5B are schematic sectional views showing the method for manufacturing the wiring board according to the one exemplary embodiment.

Then, steps which are similar to those shown in FIGS. 3B and 3C are performed again. Thereby, as shown in FIG. 5A, the insulating layer 33 having the through holes VH3 is stacked on the lower surface of the insulating layer 32. Also, the insulating layer 53 having the through holes VH6 is stacked on the upper surface of the insulating layer 52.

In the case where the through holes VH3, VH6 are formed by the laser processing method, then, desmearing is performed to remove resin smears adhered to the exposed surfaces of the wiring layer 42, 62 which are exposed to the through holes VH3, VH6. Desmearing roughens the inner surfaces of the through holes VH6, the upper surface 53A of the insulating layer 53, the inner surfaces of the through holes VH3, and the lower surface of the insulating layer 33.

Figure 5B:
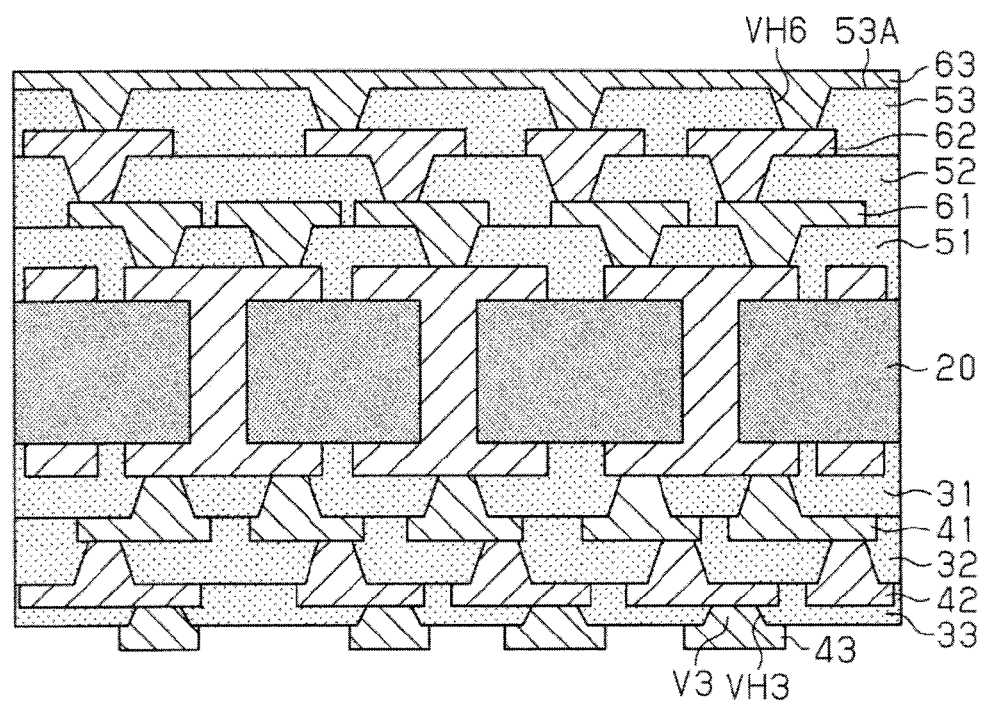

Next, in a step shown in FIG. 5B, the vias V3 are formed in the through holes VH3 of the insulating layer 33. Also, the wiring layer 41 is stacked on the lower surface of the insulating layer 33 so that the wiring layer 41 is electrically connected to the wiring layer 43 through the vias V3. The vias V3 and the wiring layer 43 may be formed by using any one of various wiring forming methods such as the semi-additive method and the subtractive method.

Also, in the step shown in FIG. 5B, a seed layer (not shown) is formed so as to cover the whole surface of the insulating layer 53 including the inner surfaces of the through holes VH6. Then, electrolytic plating (panel plating) is performed with the seed layer being used as a power supply layer. For example, the seed layer which covers the whole surface of the insulating layer 53 is formed by the electroless copper plating method. Then, electrolytic copper plating is performed with the seed layer being used as a power supply layer. As a result, a conductive layer 63 is formed which fills the through holes VH6 and which covers the whole upper surface 53A of the insulating layer 53.

Figure 6A:
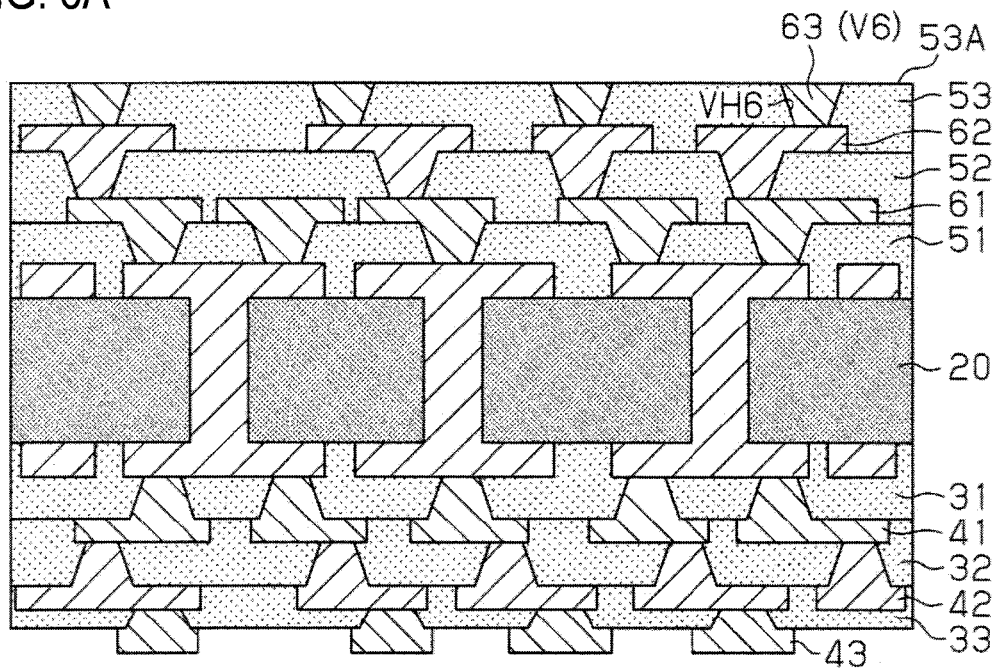
FIGS. 6A and 6B are schematic sectional views showing the method for manufacturing the wiring board according to the one exemplary embodiment.

Subsequently, in a step shown in FIG. 6A, the conductive layer 63 which protrudes from the upper surface 53A of the insulating layer 53 is polished by the CMP method or the like, while the upper surface 53A of the insulating layer 53 which is a roughened surface is polished. Thereby, the vias V6 which fill the through holes VH6 are formed. Also, the upper surface 53A of the insulating layer 53 is smoothed. As this occurs, the inner surfaces of the through holes VH6 remain in a roughened state. As a result, the upper surface 53A of the insulating layer 53 is lower in surface roughness than the inner surfaces of the through holes VH6. In this step, the upper surface 53A of the insulating layer 53 and the conductive layer 63 are polished until the upper surface 53A of the insulating layer 53 is smoothed (for example, until the surface roughness Ra of the upper surface 53A of the insulating layer 53 becomes equal to or less than 0.2 μm).

The steps shown in FIGS. 6B to 12A which will be described below are steps of forming the fine wiring structure 70 on the insulating layer 53. Therefore, illustration of the structure on the lower surface 20A side of the core substrate 20 will be omitted in FIGS. 6B to 12A.

Figure 6B:
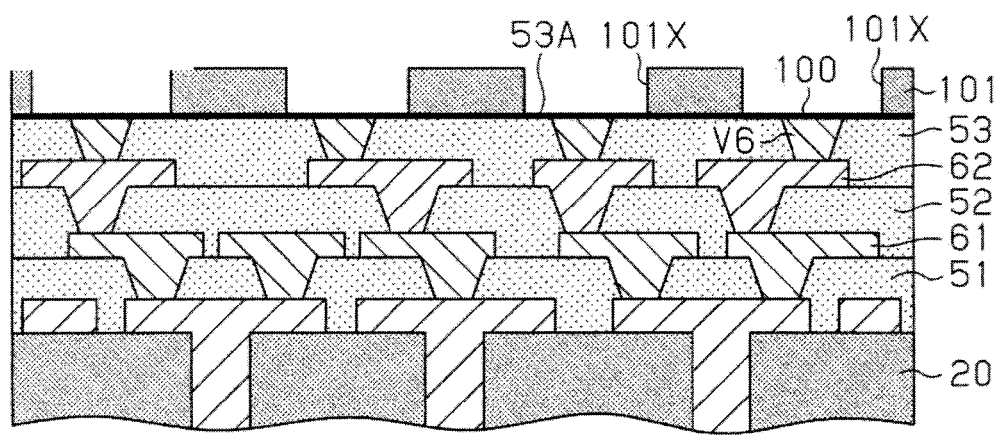

Next, in the step shown in FIG. 6B, a seed layer 100 is formed so as to cover the upper surface 53A of the insulating layer 53 and the upper end surfaces of the vias V6. The seed layer 100 may be formed by, for example, a sputtering method or an electroless plating method. The upper surface 53A of the insulating layer 53 is the smooth surface. Therefore, this step can form the seed layer 100 uniformly on the upper surface 53A, for example, by the sputtering method. Also, the upper surface of the thus-formed seed layer 100 is smooth. As compared with the case where the seed layer 100 is formed on a roughened surface by the sputtering method, the seed layer 100 can be formed thinner. The case where the seed layer 100 is formed by the sputtering method will be described in more detail below. For example, titanium (Ti) is deposited by sputtering on the upper surface 53A of the insulating layer 53 and the upper end surfaces of the vias V6 so that a Ti layer covers the upper surface 53A and the upper end surfaces of the vias V6. Then, copper is deposited on the Ti layer by sputtering, to form a Cu layer. As a result, the seed layer 100 having a two-layer structure (Ti layer/Cu layer) is formed. As this occurs, the Ti layer may be, for example, in a range of about 20 to 50 nm a thickness. Also, the Cu layer may be, for example, in a range of about 100 to 300 nm in thickness. A TiN layer configured by titanium nitride (TiN) may be used in place of the Ti layer. In this case, the seed layer 100 having a two-layer structure (the TiN layer/the Cu layer) is formed. In the case where the seed layer 100 is formed by the electroless plating method, the seed layer 100 made of a Cu layer may be formed by, for example, the electroless copper plating method.

Then, a resist layer 101 having opening patterns 101X at predetermined positions is formed on the seed layer 100. The opening patterns 101X are formed so as to expose portions of the seed layer 100 which correspond to regions where the wiring layer 71 is formed (see FIG. 1). Examples of a material of the resist layer 101 include a material having plating resistance against a plating process which will be performed in the next step. Specifically, the examples of the material of the resist layer 101 include a photosensitive dry film resist, a liquid photoresist (more specifically, a novolac-resin-based dry film resist, an acrylic-resin-based dry film resist, a novolac-resin-based liquid photoresist, and an acrylic-resin-based liquid photoresist). The case where a photosensitive dry film resist will be described below. For example, a dry film is laminated to an upper surface of the seed layer 100 by thermocompression bonding. The dry film is patterned by the photolithography method to form the resist layer 101 having the opening patterns 101X. In the case where a liquid photoresist is used, the resist layer 101 can be formed by performing similar steps. The upper surface of the seed layer 100 on which the resist layer 101 is to be formed is a smooth surface. Therefore, in this step, it is possible to suppress a patterning defect from being caused in the resist layer 101. Namely, the opening patterns 101X can be accurately formed in the resist layer 101.

Figure 7A:
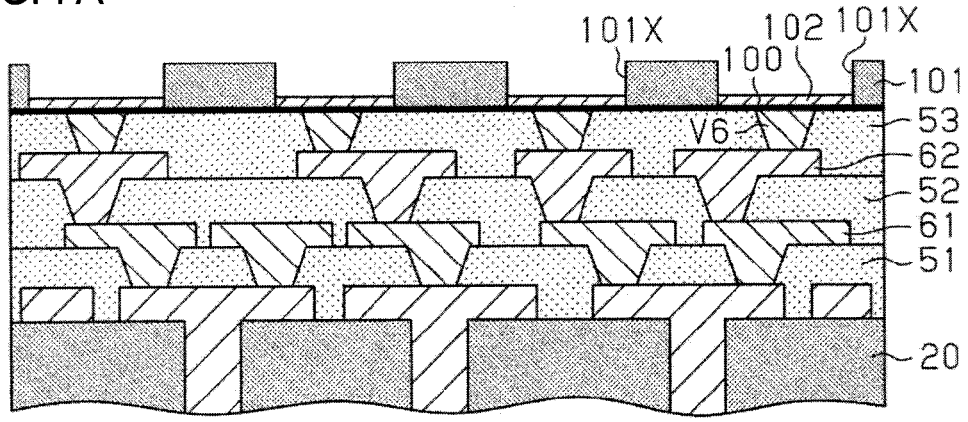
FIGS. 7A and 7B are schematic sectional views showing the method for manufacturing the wiring board according to the one exemplary embodiment.
Figure 7B:
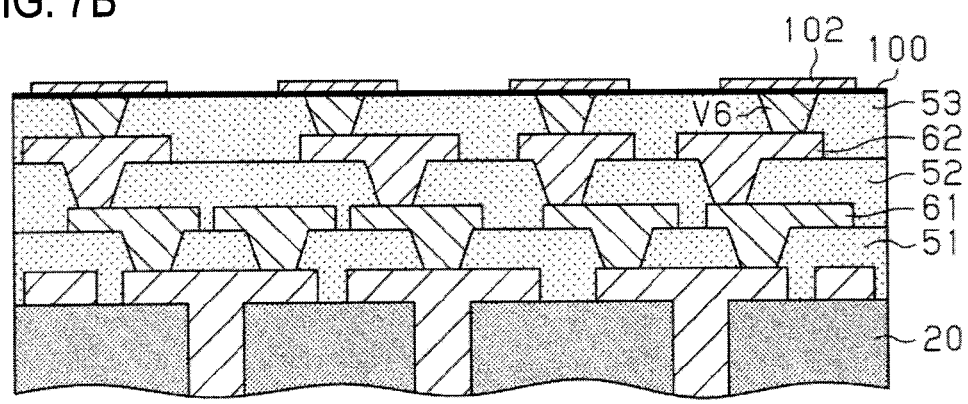

Next, in the step shown in FIG. 7A, an electrolytic plating method is performed for the upper surface of the seed layer 100 with the resist layer 101 being used as a plating mask. The electrolytic plating method uses the seed layer 100 as a plating power supply layer. Specifically, the electrolytic plating method (here, the electrolytic copper plating method) is performed for the upper surface of the seed layer 100 which is exposed through the opening patterns 101X of the resist layer 101. Thereby, an electrolytic copper plated layer 102 is formed on the upper surface of the seed layer 100. Then, in the step shown in FIG. 7B, the resist layer 101 shown in FIG. 7A is removed by, for example, an alkaline stripping solution.

Figure 8A:
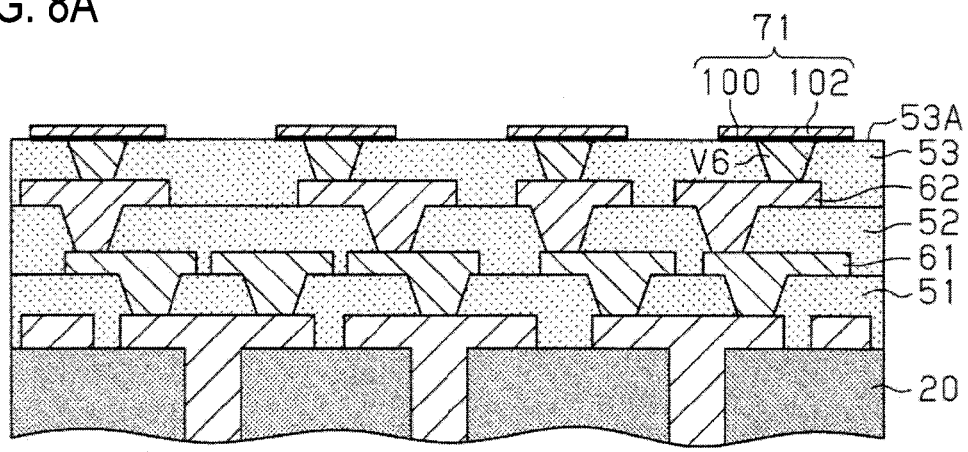
FIGS. 8A and 8B are schematic sectional views showing the method for manufacturing the wiring board according to the one exemplary embodiment.

Next, in the step shown in FIG. 8A, unnecessary portions of the seed layer 100 are removed by etching with the electrolytic copper plated layer 102 being used as an etching mask. As a result, the wiring layer 71 which is configured by the seed layer 100 and the electrolytic copper plated layer 102 is formed on the insulating layer 53. In this way, the wiring layer 71 which is finer than the lower wiring layers 61, 62 and the like is formed by the semi-additive method.

Figure 8B:
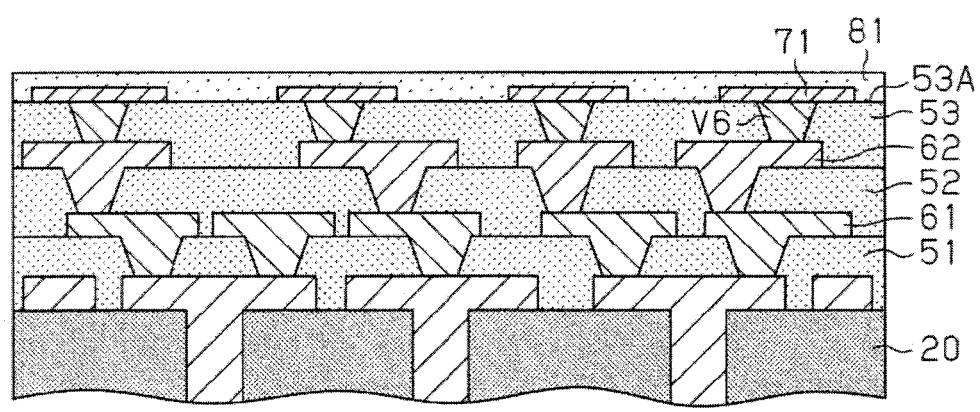

Next, in the step shown in FIG. 8B, the insulating layer 81 is formed on the upper surface 53A of the insulating layer 53 so as to cover the whole surface of the wiring layer 71. For example, a resin film is laminated to the upper surface 53A of the insulating layer 53 by thermocompression bonding. Thereby, the insulating layer 81 is formed. Examples of the resin film include a film made of a photosensitive resin such as a phenol resin and a polyimide resin.

Subsequently, in the step shown in FIG. 9A, the through holes VH7 are formed at the required positions of the insulating layer 81 by, for example, the photolithography method so that the upper surface of the wiring layer 71 are partly exposed through the through holes VH7.

Figure 9A:
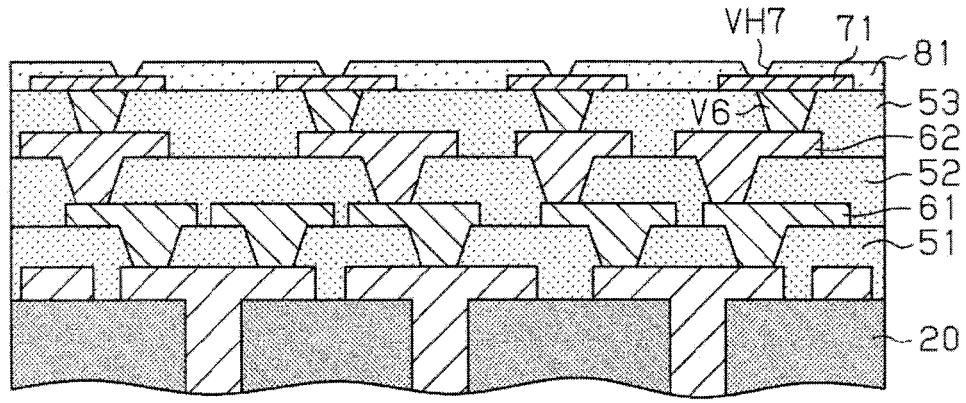
FIGS. 9A and 9B are schematic sectional views showing the method for manufacturing the wiring board according to the one exemplary embodiment.
Figure 9B:
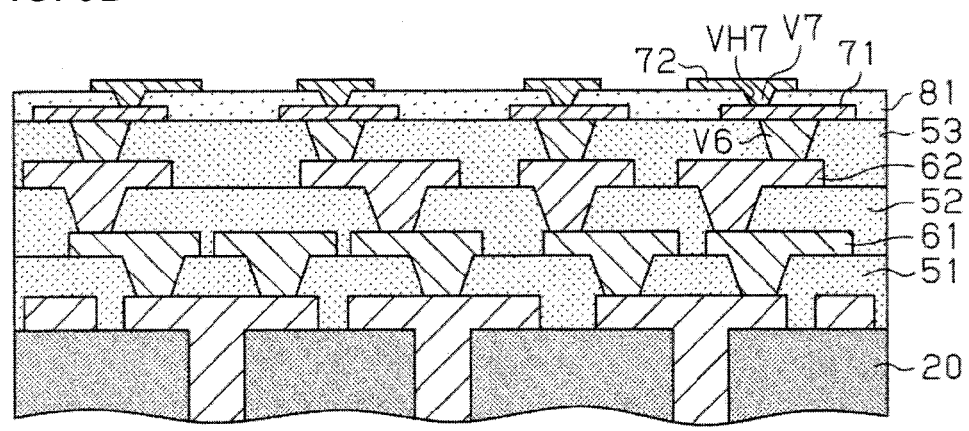

Next, in the step shown in FIG. 9B, the vias V7 are formed so as to fill the through holes VH7. Also, the wiring layer 72 is formed on the insulating layer 81. The vias V7 and the wiring layer 72 may be formed by, for example, the semi-additive method.

Figure 10A:
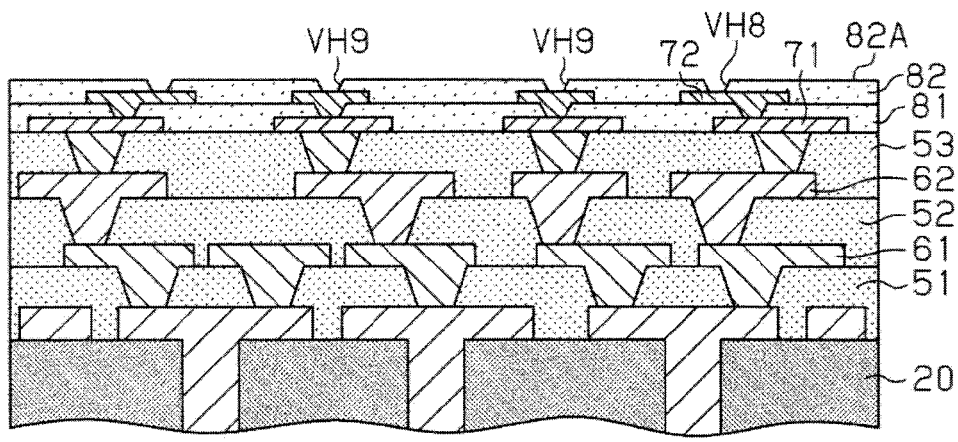
FIGS. 10A and 10B are schematic sectional views showing the method for manufacturing the wiring board according to the one exemplary embodiment.

Similarly to the steps shown in FIGS. 8B and 9A, in the step shown in FIG. 10A, the insulating layer 82 having the through holes VH8, VH9 is formed on the insulating layer 81 so that upper surface of the wiring layer 72 are partly exposed through the through holes VH8, VH9.

Figure 10B:
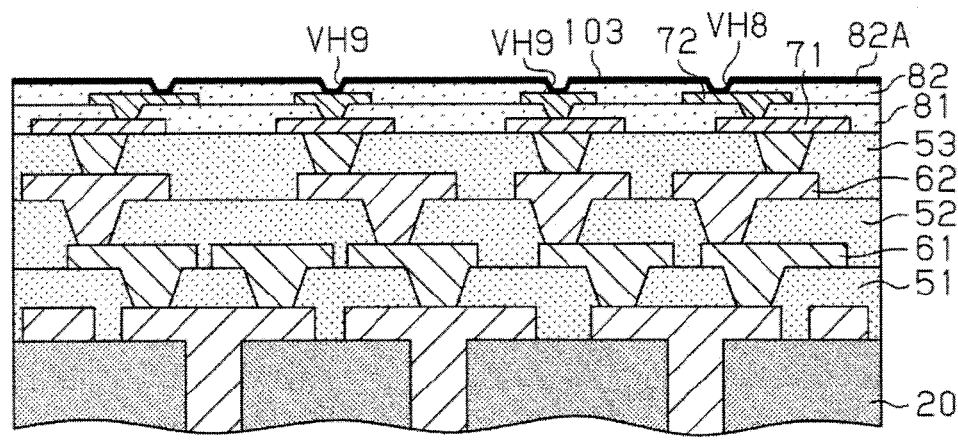

Next, in the step shown in FIG. 10B, a seed layer 103 is formed so as to cover the whole upper surface 82A of the insulating layer 82 including the inner surfaces of the through holes VH8, VH9. The seed layer 103 may be formed by, for example, a sputtering method or an electroless plating method. The case where the seed layer 103 is formed by the sputtering method will be described below. For example, titanium is deposited on the upper surface 82A of the insulating layer 82 by sputtering so that a Ti layer covers the whole upper surface 82A of the insulating layer 82 including the inner surfaces of the through holes VH8, VH9. Then, copper is deposited on the Ti layer by the sputtering method, so as to form a Cu layer. As a result, the seed layer 103 having a two-layer structure (Ti layer/Cu layer) is formed. As this occurs, the Ti layer may be, for example, in a range of about 20 to 50 nm in thickness. Also, the Cu layer may be, for example, in a range of about 100 to 300 nm in thickness. A TiN layer configured by titanium nitride (TiN) may be used in place of the Ti layer. In this case, the seed layer 103 having a two-layer structure (TiN layer/Cu layer) is formed. In the case where the seed layer 103 is formed by an electroless plating method, the seed layer 103 configured by a Cu layer may be formed by the electroless copper plating method.

Figure 11A:
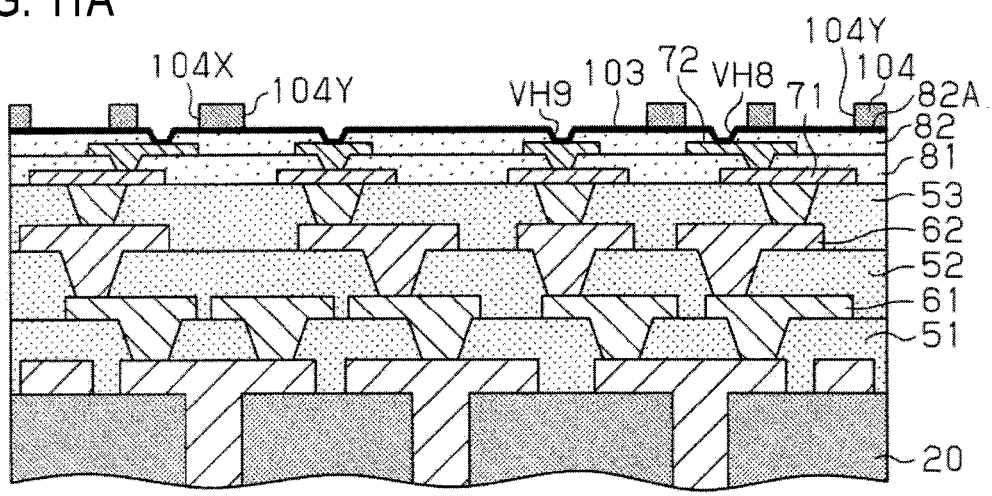
FIGS. 11A and 11B are schematic sectional views showing the method for manufacturing the wiring board according to the one exemplary embodiment.

Next, in the step shown in FIG. 11A, a resist layer 104 is formed on the seed layer 103 so that the resist layer 104 has opening portions 104X, 104Y which correspond to the wiring layer 73 and the plane layer 74, respectively.

Figure 11B:
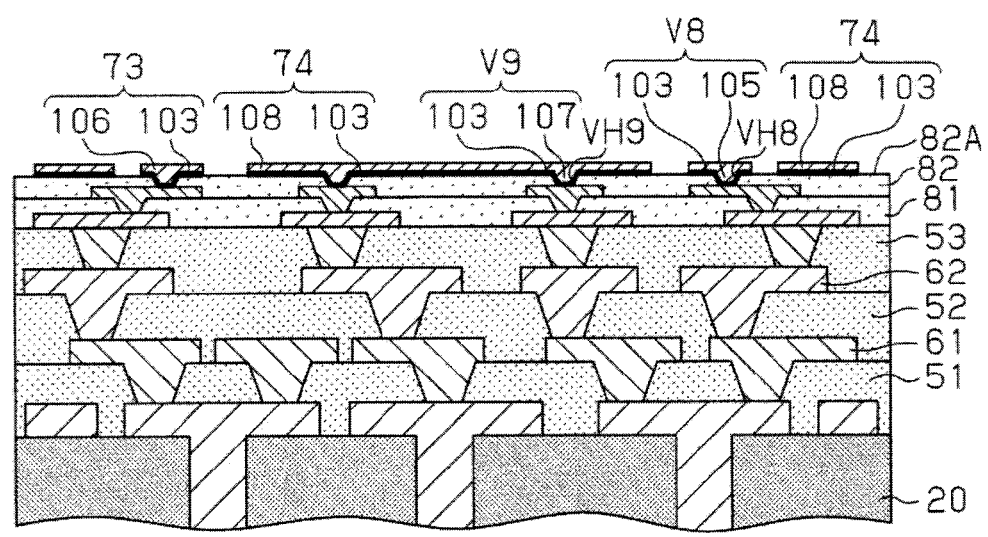

Subsequently, in the step shown in FIG. 11B, an electrolytic plating method (for example, the electrolytic copper plating method) is performed with using the seed layer 103 as a plating power supply layer. Thereby, an electrolytic copper plated layer 105 which fills the through holes VH8 is formed. Also, an electrolytic copper plated layer 106 is formed on the electrolytic copper plated layer 105 and parts of the seed layer 103, which are exposed through the opening portions 104X of the resist layer 104. Furthermore, an electrolytic copper plated layer 107 which fills the through holes VH9 is formed. Also, an electrolytic copper plated layer 108 is formed on the electrolytic copper plated layer 107 and parts of the seed layer 103, which are exposed through the openings 104Y of the resist layer 104. Similarly to the steps shown in FIGS. 7B and 8A, the resist layer 104 is removed, and then unnecessary portions of the seed layer 103 are removed by etching with the electrolytic copper plated layers 106, 108 being used as an etching mask. As a result, the vias V8 configured by the seed layer 103 and electrolytic copper plated layer 105, which are formed in the through holes VH8 are formed. Also, the wiring layer 73 configured by the seed layer 103 and electrolytic copper plated layer 106, which are formed on the upper surface 82A of the insulating layer 82, is formed. Moreover, the vias V9 configured by the seed layer 103 and electrolytic copper plated layer 107, which are formed in the through holes VH9, are formed. Also, the plane layer 74 configured by the seed layer 103 and electrolytic copper plated layer 108, which are formed on the upper surface 82A of the insulating layer 82, is formed. In this way, the vias V8, V9, the wiring layer 73, and the plane layer 74 are formed by, for example, the semi-additive method.

Figure 12A:
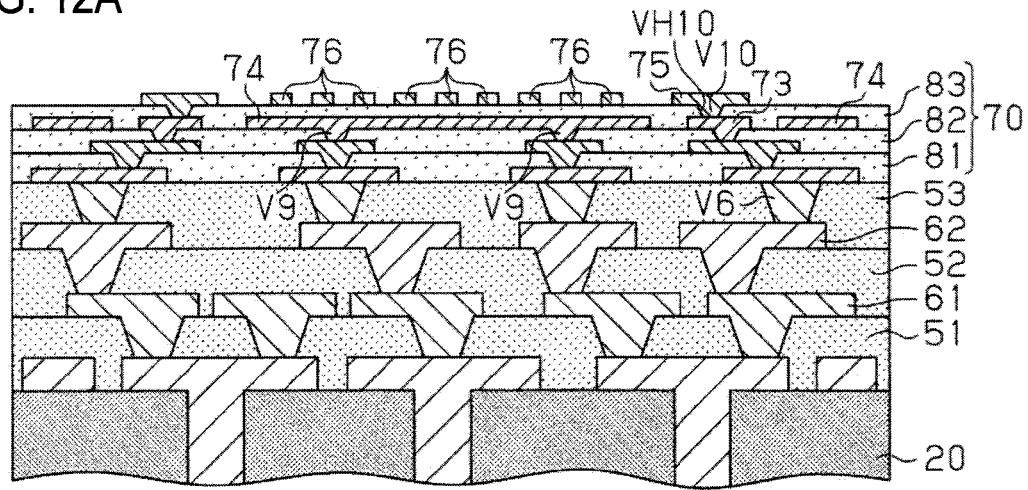
FIGS. 12A and 12B are schematic sectional views showing the method for manufacturing the wiring board according to the one exemplary embodiment.

Similarly to the step shown in FIG. 10A, in the step shown in FIG. 12A, the insulating layer 83 is formed on the insulating layer 82 so that the insulating layer 83 covers the wiring layer 73 and the plane layer 74 and has the through holes VH10 through which parts of the upper surface of the wiring layer 73 are exposed. Then, similarly to the steps shown in FIGS. 10B to 11B, the vias V10 which fill the through holes VH10 are formed. Also, the uppermost wiring layer 75 and the signal wirings 76 are formed on the insulating layer 83.

Figure 12B:
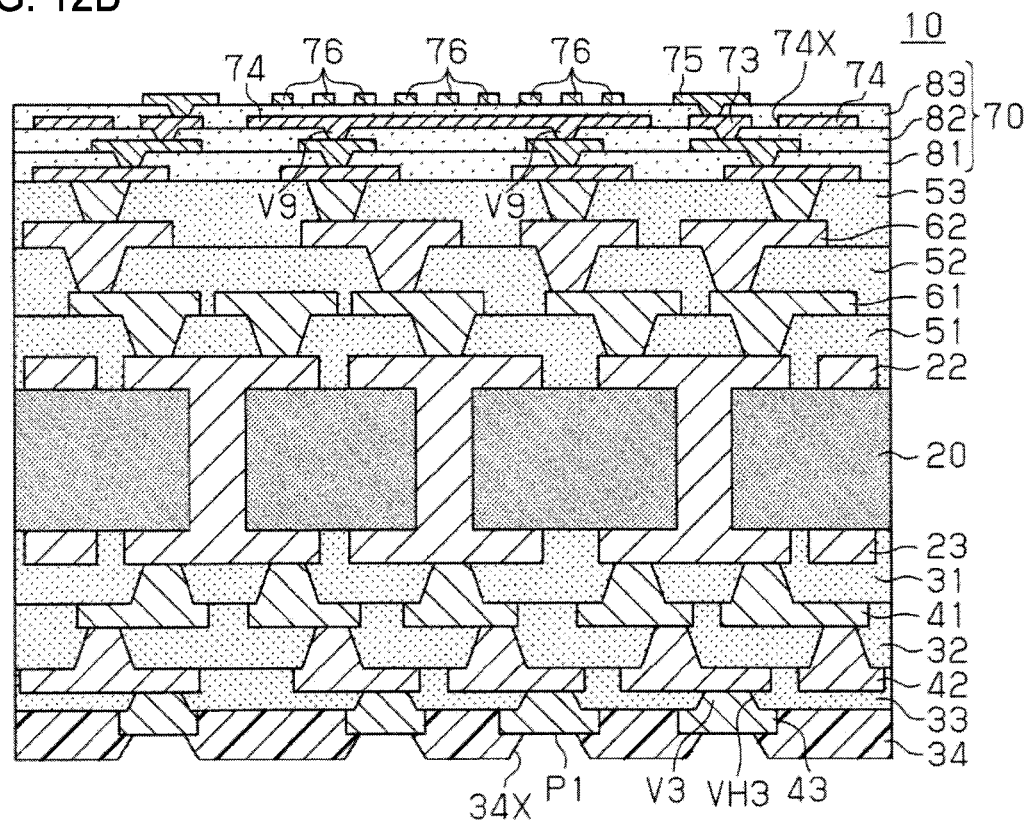

Then, in a step shown in FIG. 12B, the solder resist layer 34 is stacked on the lower surface of the insulating layer 33 so that the solder resist layer 34 has the opening portions 34X. The external connection pads P1, which are defined at required positions of the lowermost wiring layer 43, are exposed through the opening portions 34X. The solder resist layer 34 may be formed by, for example, (i) laminating a photosensitive solder resist film or (ii) applying a liquid solder resist and patterning the solder resist into a desired shape. As a result, parts of the wiring layer 43 are exposed through the opening portions 34X of the solder resist layer 34. The exposed parts of the wiring layer 43 serve as the external connection pads P1. As required, for example, a Ni layer and an Au layer may be sequentially stacked on the exposed parts of the wiring layer 43 which are exposed through the opening portions 34X of the solder resist layer 34 (namely, on the external connection pads P1). The Ni layer and the Au layer may be formed by, for example, an electroless plating method.

The wiring board 10 shown in FIG. 1 can be manufactured in the above-described manufacturing steps.

The above-described exemplary embodiment provides the following advantages.

(1) In the region just below the signal wirings 76, the through holes 74X are not formed in the plane layer 74, but the vias V9 which connect the plane layer 74 with the lower wiring layer 72 are formed. The vias V9 increases the contact area between (i) the vias V9 and the plane layer 74 and (ii) the insulating layer 82. As compared with the case where the vias V9 are not formed in the region just below the signal wirings 76 and the case where a through hole is formed in the plane layer 74 in the region just below the signal wirings 76, the adhesiveness between the plane layer 74 and the insulating layer 82 can be improved. Consequently, it is possible to suitably prevent the plane layer 74 from peeling off. Also, the through holes 74X are not formed in the region just below the signal wirings 76 as described above. Therefore, high flatness can be ensured, which leads to that the signal wirings 76 (fine wirings) can be accurately formed and that the quality of the signal wirings 76 can be improved. Accordingly, in the wiring board 10 of this exemplary embodiment, the fine wirings can be formed accurately while the plane layer 74 is prevented from peeling off.

(2) In the case where the through holes 74X are formed in the plane layer 74 in the region just below the signal wirings 76, the characteristic impedances would be discontinuous and the electric characteristics would be deteriorated. To deal with these matters, in the wiring board 10 of the exemplary embodiment, the through holes 74X are not formed in the region just below the signal wirings 76. Therefore, it is possible to obtain the plane layer 74 which is formed continuously in the plane direction. With the configuration, it is possible to prevent the characteristic impedances from being discontinuous, and the electric characteristics can be improved.

(3) In the region not overlapping the signal wirings 76 in a plan view (for example, a region where it is not necessary to consider the flatness for formation of the signal wirings 76 or the electric characteristics of the signal wirings 76 and a region where the through holes 74X do not seriously affect the flatness for the formation of the signal wirings 76 or the electrical characteristics of the signal wirings 76), the through holes 74X are formed in the plane layer 74. With this configuration, the insulating layers 82, 83 are connected to each other through the through holes 74X. Therefore, the adhesiveness between the plane layer 74 and the insulating layers 82, 83 can be improved. Also, there is moisture which has been contained in, for example, the insulating layer 82 and which is vaporized in a heating test or the like. The moisture can be released to the outside through between the through holes 74X and the upper wiring layer 75. Therefore, peeling off of the plane layer 74 due to the moisture can be suitably prevented.

(4) The plane layer 74 and the vias V9 are integrally formed. With this configuration, the plane layer 74 having the vias V9 can be suitably prevented from peeling off, as compared with the case where the plane layer 74 and the vias V9 are separately formed.

OTHER EXEMPLARY EMBODIMENTS

The invention may be implemented by appropriately modifying the exemplary embodiment as follows.

The numbers, wiring routings, and the like of the wiring layers 71 to 73, 75, plane layer 74, signal wirings 76, and insulating layers 81 to 83 of the fine wiring structure 70 in the exemplary embodiment can be modified or changed in various manners.

Figure 13:
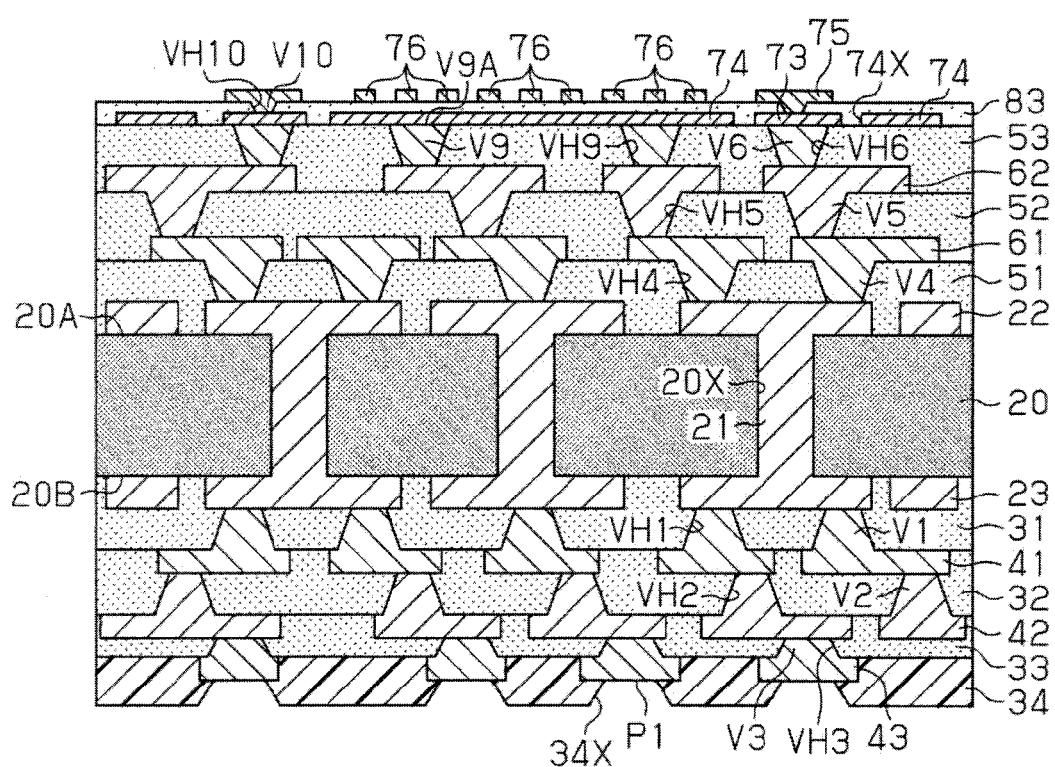
FIG. 13 is a schematic sectional view showing a wiring board according to a modified example.

As shown in FIG. 13, for example, the plane layer 74 may be formed on the insulating layer 53. The insulating layer 83 which covers the plane layer 74 may be stacked on the insulating layer 53. The signal wirings 76 may be formed on the insulating layer 83. Similar to the exemplary embodiment, in this case, the vias V9 (through holes VH9) for connecting the plane layer 74 with the lower wiring layer 62 are formed at positions which overlap the signal wirings 76 in a plan view. The through holes 74X of the plane layer 74 are formed at positions which do not overlap the signal wirings 76 in a plan view. This configuration provides advantages similar to those of (1) to (3) of the exemplary embodiment. In this case, the vias V9 and the plane layer 74 are separately formed. Namely, the plane layer 74 is formed so as to be connected to end surfaces V9A (here, upper end surfaces) of the vias V9. In this case, the plane layer 74 and the vias V9 can be formed in manufacturing steps similar to those shown in FIGS. 5B to 8A. That is, the plane layer 74 and vias V9 in this case can be formed in a similar manner to the wiring layer 71 and vias V6 in the above-described exemplary embodiment.

The sectional shapes of the through holes VH1 to VH10 and vias V1 to V10 in the exemplary embodiment are not particularly limited. For example, the through holes VH1 to VH10 and the vias V1 to V10 may be formed so as to have substantially rectangular (straight) shapes in a sectional view.

A metal layer may be formed on the uppermost wiring layer 75 and signal wirings 76 of the exemplary embodiment. Examples of the metal layer include (i) a metal layer in which a Ni layer/an Au layer are stacked on the upper surface of the wiring layer 75 in order, (ii) a metal layer in which a Ni layer/a Pd layer/an Au layer are stacked on the upper surface of the wiring layer 75 in order, (iii) a metal layer in which a Ni layer/a Pd layer/an Ag layer are stacked on the upper surface of the wiring layer 75 in order, and (iv) a metal layer in which a Ni layer/a Pd layer/an Ag layer/an Au layer are stacked on the upper surface of the wiring layer 75 in order. Each of the Ni layer, the Au layer, the Pd layer, and the Ag layer, may be a metal layer formed by an electroless plating method (an electroless plated metal layer).

Alternatively, an OSP film may be formed on the wiring layer 75 and the signal wirings 76.

The numbers, wire routings, and the like of the wiring layers 41, 42, 43, 61, 62, and insulating layers 31, 32, 33, 51, 52, 53 of the wiring board 10 of the exemplary embodiment may be modified or changed in various manners.

In the exemplary embodiment, the fine wiring structure 70 is formed on the cored build-up board having the core substrate 20. It should be noted that the lower-layer structure below the fine wiring structure 70 is not particularly limited. For example, the fine wiring structure 70 may be formed on a coreless board not having a core substrate.

[Clauses]

This disclosure further encompasses various exemplary embodiments, for example, described below.

1. A method for manufacturing a wiring board, comprising:
   forming a first insulating layer that covers a first wiring layer;
   forming a first through hole that exposes a surface of the first wiring layer, on a surface of the first insulating layer;
   forming a via that fills the first through hole;
   stacking, on the first insulating layer, a plane layer that includes a second through hole exposing the surface of the first insulating layer and that is connected to the via;
   forming a second insulating layer that at least partially fills the second through hole and that covers the plane layer; and
   forming signal wirings so that the first through hole overlaps the signal wirings in a plan view and the second through hole does not overlap the signal wirings in a plan view.

The exemplary embodiments have been described above in detail. It should be noted that the invention is not limited thereto. Various modifications and changes may be made within the scope of the spirit of the invention set forth in claims.

What is claimed is:

1. A wiring board, comprising: a first insulating layer that covers a first wiring layer;
   a first through hole that opens on a surface of the first insulating layer and that exposes a surface of the first wiring layer;
   a via that fills the first through hole;
   a plane layer that is connected to the via and that is stacked on the first insulating layer;
   a second through hole that opens on a surface of the plane layer and that exposes the surface of the first insulating layer;
   a second wiring layer that is formed in the second through hole;
   a second insulating layer that at least partially fills the second through hole and that covers the plane layer; and
   signal wirings that are stacked on the second insulating layer, wherein the first through hole overlaps the signal wirings in a plan view, the second through hole does not overlap the signal wirings in a plan view,
   and
   no through hole is formed in the plane layer at a position which overlaps a region including the signal wirings and, gaps between adjacent signal wirings in a plan view; wherein the signal wirings are arranged at 20 μm pitch or less.

2. The wiring board according to claim 1, wherein the plane layer includes a conductive layer formed on the first insulating layer in a solid shape.

3. The wiring board according to claim 1, wherein the second wiring layer is insulated from the plane layer.

4. The wiring board according to claim 1, wherein the plane layer and the via are formed integrally.

5. A wiring board, comprising: a first insulating layer that covers a first wiring layer;
   a first through hole that opens on a surface of the first insulating layer and that exposes a surface of the first wiring layer;
   a via that fills the first through hole;
   a plane layer that is connected to the via and that is stacked on the first insulating layer;
   a second through hole that opens on a surface of the plane layer and that exposes the surface of the first insulating layer;
   a second wiring layer that is formed in the second through hole;
   a second insulating layer that at least partially fills the second through hole and that covers the plane layer; and
   signal wirings that are stacked on the second insulating layer, wherein the first through hole overlaps the signal wirings in a plan view, the second through hole does not overlap the signal wirings in a plan view,
and
no through hole is formed in the plane layer at a position which overlaps a region including the signal wirings and, gaps between adjacent signal wirings in a plan view; wherein the plane layer is connected to an end surface of the via, and the first insulating layer and the second insulating layer are different in material from each other.

* * * * *